United States Patent [19]

Sato et al.

[11] Patent Number: 4,861,148
[45] Date of Patent: Aug. 29, 1989

[54] PROJECTION OPTICAL SYSTEM FOR USE IN PRECISE COPY

[75] Inventors: Takeo Sato, Sagamihara; Nobuhiro Araki, Yokohama; Koichi Kawata, Tama; Noboru Nomura, Kyoto; Atushi Ueno, Hirakata; Shotaro Yoshida, Sendai, all of Japan

[73] Assignee: Matsushita Electric Industrial Co., Inc., Osaka, Japan

[21] Appl. No.: 24,134

[22] Filed: Mar. 11, 1987

[30] Foreign Application Priority Data

Mar. 12, 1986 [JP] Japan .................................. 61-54051
Jul. 7, 1986 [JP] Japan .................................. 61-159055

[51] Int. Cl.⁴ ....................... G02B 17/08; G02B 27/10
[52] U.S. Cl. ..................................... 350/505; 350/443; 350/620; 350/174
[58] Field of Search ........... 350/505, 503, 504, 162.12, 350/448, 442, 443, 620, 619, 622, 171, 174

[56] References Cited

U.S. PATENT DOCUMENTS

| 2,327,947 | 8/1943 | Warmisham | 350/443 |
| 2,344,756 | 3/1944 | Warmisham | 350/443 |
| 2,380,887 | 7/1945 | Warmisham | 350/443 |
| 2,683,394 | 7/1954 | Polanyi et al. | 350/443 |
| 2,891,437 | 6/1959 | Tripp | 350/443 |
| 3,325,238 | 6/1967 | Geier | 350/443 |

FOREIGN PATENT DOCUMENTS

| 117518 | 9/1943 | Australia | 350/443 |
| 55-17196 | 2/1980 | Japan . | |
| 57-12966 | 3/1982 | Japan . | |
| 867251 | 5/1961 | United Kingdom | 350/443 |
| 1388545 | 3/1975 | United Kingdom | 350/442 |

OTHER PUBLICATIONS

Optica Acta, 1981, vol. 28, No. 11, 1477–1484, by David R. Shafer.

Primary Examiner—Bruce Y. Arnold
Assistant Examiner—Ronald M. Kachmarik
Attorney, Agent, or Firm—Stevens, Davis, Miller & Mosher

[57] ABSTRACT

A projection optical system for use in a precise copy which uses a pair of catadioptric optical systems consisting of convex mirrors, concave mirrors, and phase correction members is shown. Two catadioptric optical systems commonly use an entrance pupil on a coaxis and are coupled so as to respectively face the phase correction members. Each of the concave mirrors has an opening at the center. Each of the convex mirrors has no opening in one embodiment but has an opening portion at the center in another embodiment.

4 Claims, 7 Drawing Sheets

PROJECTION OPTICAL SYSTEM FOR USE IN PRECISE COPY

BACKGROUND OF THE INVENTION

The present invention relates to a projection optical system for use in a precise copy which is suitable for use in the case of ultrashort wavelengths such as ultraviolet rays, far ultraviolet rays, and the like.

Hitherto, a projection optical system for use in a precise copy which consists of a refractive system using lenses has been known as shown in, e.g., Japanese patent publication (JP-B) No. 12966/82. Another projection optical system consisting of a reflecting system has also been known as shown in Japanese laid-open patent publication (JP-A) No. 17196/80.

The conventional projection optical systems for use in a precise copy will be described hereinbelow with reference to the drawings.

Figure 1:
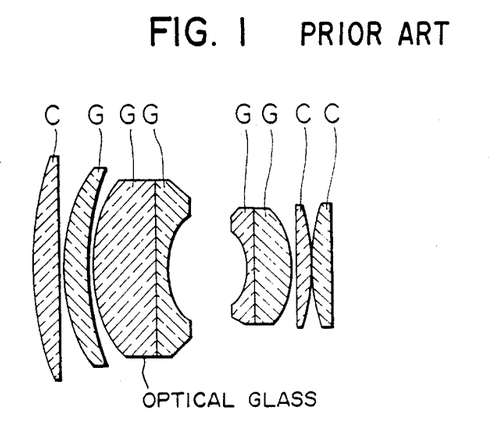
FIG. 1 is an overall cross sectional view of a reducing projection optical system for use in a copy which uses a conventional refracting system.
Figure 2:
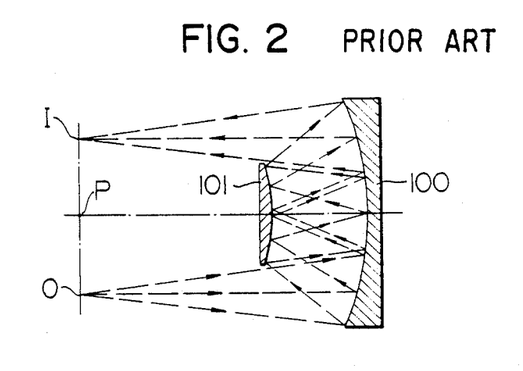
FIG. 2 is a cross sectional view of a projection optical system for use in a copy which uses a conventional reflecting system.

As shown in FIG. 1, the optical system consisting of the refracting system uses a plurality of lenses consisting of optical glasses G and optical crystal materials C and is the reducing system having an image magnification of 1/10. On the other hand, as shown in FIG. 2, the projection optical system using the reflecting system has a telecentric constitution such that the light emitted from an object O are sequentially reflected by a main mirror 100, an auxiliary mirror 101, and the main mirror 100, thereby forming an image I of equal magnification of 1/1 onto the same plane as the object O.

A resolution limit D of the projection optical system is expressed using an equation of Rayleigh as follows.

$$D = 0.61 \frac{\lambda}{NA}$$

where, NA is a numerical aperture on the side of the image of the optical system and $\lambda$ is a wavelength which is used. In order to improve the resolving power, it is sufficient to reduce the wavelength $\lambda$ or to increase the numerical aperture NA of the optical system. However, the improvement of the numerical aperture NA makes the optical design of the lenses considerably difficult. Therefore, the reduction of the wavelength $\lambda$ is becoming the main consideration.

In the conventional refracting optical system shown in FIG. 1, when the wavelength $\lambda$ is reduced to a value in the range of the ultraviolet rays, the transmittance extremely decreases. For example, even if the glasses whose characteristics were adjusted for use in the wavelengths in the range of, particularly, the ultraviolet rays, such as glasses of UBK7 made by schott, Co., Ltd. are used, when the wavelength is 280 nm, the transmittance extremely decreases to 23% (when the thickness of glass is 5 mm). On the other hand, among the optical crystal materials C, there are such materials that a transmittance of about 80% can be obtained even in the case of the wavelength of about 200 nm as in the synthetic crystal of $TiF_2$, $CaF_2$, or Kcl. However, in general, it is difficult to obtain a large sized crystal material and the working efficiency is very bad and it is difficult to work with a high precision. In addition, since the number of kinds of such crystal materials is limited, the degree of design freedom is small. There is the case of realizing a rediffraction optical system having a large numerical aperture NA with a high transmittance held by use of the limited number of lenses in the case of the wavelength in the range of the ultraviolet rays or of the far ultraviolet rays. In this case, the aberration cannot be sufficiently corrected and it is difficult to constitute the optical system by only the refracting materials.

Figure 3:
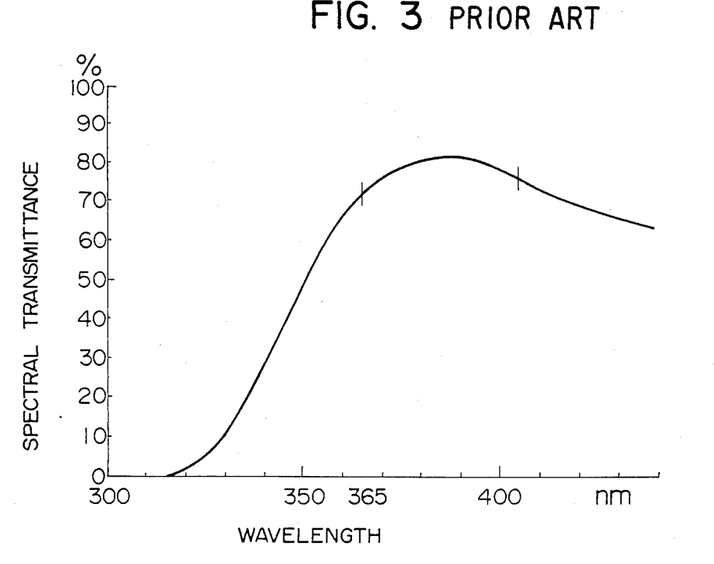
FIG. 3 is a diagram showing the spectral transmittance of the conventional example shown in FIG. 1.

FIG. 3 is a graph showing the spectral transmittance of the reducing projection optical system shown in FIG. 1. As will be obvious from this graph, when the use wavelength is below 300 nm, the transmittance is almost 0 and the wavelength in the range of the ultraviolet rays cannot be used.

Figure 4:
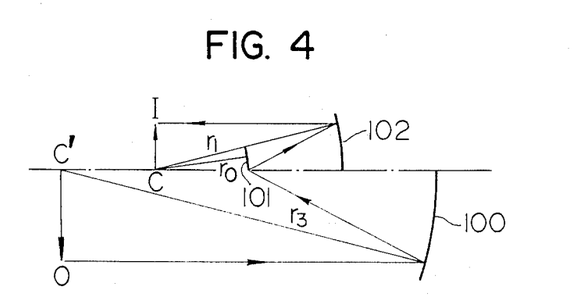
FIG. 4 is an imaginary schematic diagram in the case where the conventional example shown in FIG. 2 was modified to the reducing system.

On the other hand, since the example of FIG. 2 is constituted by only the reflecting mirrors, the use wavelength is not limited. However, since the main mirror 100 and auxiliary mirror 101 are coaxially arranged with respect to a point P on the axis of the object O and image I, the spherical aberration, coma aberration, and distortion aberration are preferably corrected. However, since the astigmatism in the tangential direction is large, the image plane is curved. To avoid this problem, a slit is used and an arc-shaped field is formed at such an image height that the astigmatisms in the tangential and sagittal directions coincide and the astigmatic difference becomes 0. For example, in the exposing of a mask pattern onto a semiconductive wafer, a necessary projection field is obtained by simultaneously scanning the mask as an object O and a wafer as an image plane I, thereby realizing the optical system near the zero aberration. However, when the reflecting optical system is constituted as a reducing optical system, it becomes as shown in FIG. 4. If the telecentric is held, all of the main mirror 100, a main mirror 102, and the auxiliary mirror 101 are not coaxially arranged. Namely, when the main mirror 102 and auxiliary mirror 101 are coaxially arranged around the point C, the center of the main mirror 100 is deviated to C', so that the outer axial aberration deteriorates. Further, since the object O and image I are not located on the same plane, it is necessary to individually scan the mask and wafer and to change the scanning speed in accordance with only the ratio of the image magnification. Since the error of the scanning speed results in the distortion of the image upon projection, it is necessary to accurately control the scanning speed. However, as the projected image becomes fine, it becomes fairly difficult to accurately control the scanning speed. Thus, in realizing the reducing optical system using the reflecting optical system as shown in FIG. 4, there are problems of the correction of the optical abberration and the mechanism.

SUMMARY OF THE INVENTION

It is an object of the present invention to solve the foregoing problems and to provide a projection optical system for use in a precise copy in which the amount of absorbed light is reduced as much as possible, high transmittances in the ranges of the ultraviolet rays and of the far ultraviolet rays are provided, and a small optical aberration and a high resolving power are obtained.

Another object of the invention is to provide a projection optical system for use in a precise copy in which even under coherent illumination, the loss due to the reflecting mirror is eliminated, the overlaps of the zeroth-degree and the ± first-degree diffracted lights are derived to thereby form an image, and a fine pattern is projected.

According to the present invention, a pair of catadioptric optical systems each having a phase correction member, a convex mirror member, and a concave mirror member which has an opening at the center so as to be rotationally symmetrical around the reference axis as a center are coupled in a manner such as to commonly have an entrance pupil on the coaxis and to respectively face the phase correction members. The invention can be applied to both cases where an opening is formed at the center of the convex mirror member and where no opening is formed at the center thereof.

DETAILED DESCRIPTION OF THE INVENTION

An embodiment of the present invention will be described in detail with reference to the drawings.

Figure 5:
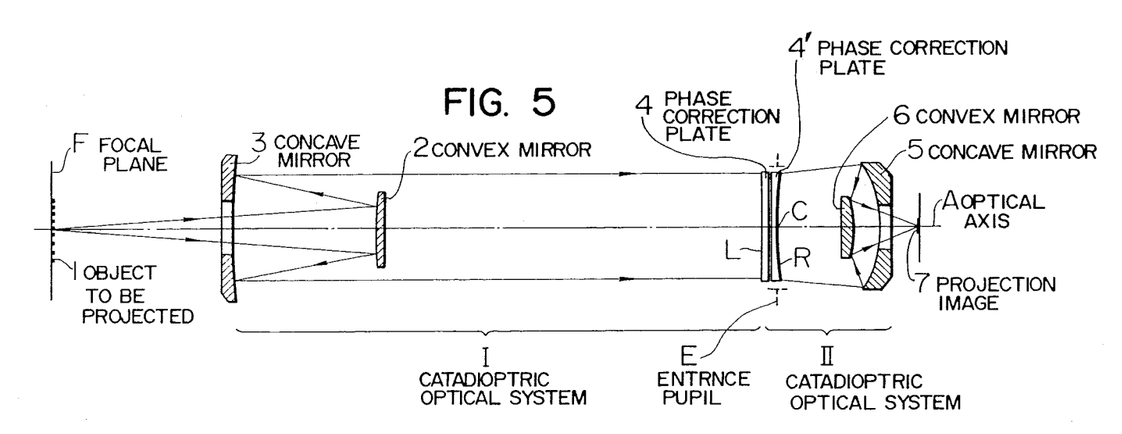
FIG. 5 is a schematic diagram of a projection optical system for use in a precise copy according to the first embodiment of the present invention.

FIG. 5 is an overall cross sectional view showing a projection optical system for use in a precise copy according to the first embodiment of the present invention.

A catadioptric optical system I on the object point side is constituted by a convex mirror 2, a concave mirror 3 having an opening at the center, and a phase correction plate 4. An object 1 to be projected is placed on a focal plane F of the catadioptric optical system I. In the optical system I, the concave mirror 3, convex mirror 2, and phase correction plate 4 are arranged in accordance with this order for the object 1. A catadioptric optical system II on the image point side is constituted by a phase correction plate 4', a concave mirror 5 having an opening at the center, and a convex mirror 6. In the optical system II, the phase correction plate 4', convex mirror 6, and concave mirror 5 are arranged in accordance with this order for the object 1. The catadioptric optical systems I and II are coupled in a manner such as to commonly have an entrance pupil E on the coaxis and to respectively face the phase correction plates 4 and 4' which are disposed at a slight distance.

The convex mirror 2 and concave mirror 3, and the convex mirror 6 and concave mirror 5 are respectively coaxially arranged around a point C, as a center, on an optical axis A of the entrance pupil E. The surface on the L (left) side of the phase correction plate 4, i.e., on the side of the convex mirror 2, the surface on the R (right) side of the phase correction plate 4', i.e., on the side of the convex mirror 6, and the concave mirrors 3 and 5 are formed as aspheric surfaces.

Light emitted from one point of object 1 passes through the opening of the concave mirror 3 and is reflected to the side of the object 1 by the convex mirror 2. Thereafter, the light is reflected again by the concave mirror 3 and passes through the phase correction plate 4. Light transmitted through the phase correction plate 4 is then a parallel beam and enters the phase correction plate 4' disposed at a slight distance away from the phase correction plate 4 and is reflected to the side of the object 1 by the concave mirror 5. Then, the reflected light is again reflected by the convex mirror 6 to the side opposite to the object 1 and passes through the opening of the concave mirror 5. Thus, a projection image 7 is formed in the plane perpendicular to the reference axis and behind the concave mirror 5.

An image magnification $\beta$ in the first embodiment will now be described with reference to FIG. 6. It is assumed that a height of object is $h_1$, a height of image is $h_2$, a focal distance of the catadioptric optical system I is $f_1$, a focal distance of the catadioptric optical system II is $f_2$, an angle of the object height $h_1$ to the center C of the phase correction plate 4 using the optical axis A as a reference is $\theta_1$, and an angle of the image height $h_2$ to the center of the phase correction plate 4' using the optical axis A as a reference is $\theta_2$. In this case, the image magnification $\beta$ is given by the following expression.

$$\beta = \frac{h_2}{h_1} \approx \frac{f_2 \cdot \tan\theta_2}{f_1 \cdot \tan\theta_1}$$

Since the entrance pupil E is set to the top of the phase correction plate 4', $\theta_1 = \theta_2$ and the ratio $f_2/f_1$ of the focal distances is used as the magnification $\beta$. In other words, since the entrance pupil E is commonly used and the effective radii are equal, the ratio of the aperture ratios is set to the magnitude $\beta$.

Therefore, the aperture ratio of the whole system (which is obtained as a coupled system of the catadioptric optical systems I and II) to determine the theoretical resolution limit is decided by the optical system II on the projection image side. The aperture ratio can be increased because the whole system is independent of the aperture ratio of the optical system I on the side of an object to be projected. Therefore, the whole system can be easily designed and used.

The light emitted from the object 1 is once converted in parallel light by the optical system I on the object point side and the parallel light is focused by the optical system II on the image point side, thereby forming an image. Therefore, the optical system I on the object side functions as a kind of a focal converter. The incident angle of the light from the object 1 disposed at a light distance into the optical system II on the image point side can be reduced and the amount of generation of the optical aberrations out of the axis can be reduced.

In the optical systems I and II, the concave mirrors 3 and 5 and the convex mirrors 2 and 6 are coaxially arranged around the center point of the entrance pupil E as a center C. Thus, the amount of generation of coma aberration, astigmatism, and distortion aberration can be minimized. The batch projection optical system as in the present invention has a large spherical aberration as compared with the conventional one. However, the remaining spherical aberration can be eliminated by forming the phase correction plates 4 and 4' and concave mirrors 3 and 5 into aspheric surfaces as mentioned above.

The catadioptric optical system I on the side of the object to be projected and the catadioptric optical system II on the side of the projection image independently correct the spherical aberration as an aberration on the axis and the coma aberration, astigmatism, and distortion aberration as aberrations out of the axis. Therefore, even in the case where the optical systems I and II are coupled as a whole system, an optical system having a sufficiently low aberration is realized.

Practical particulars of the invention will now be described.

Figure 6:
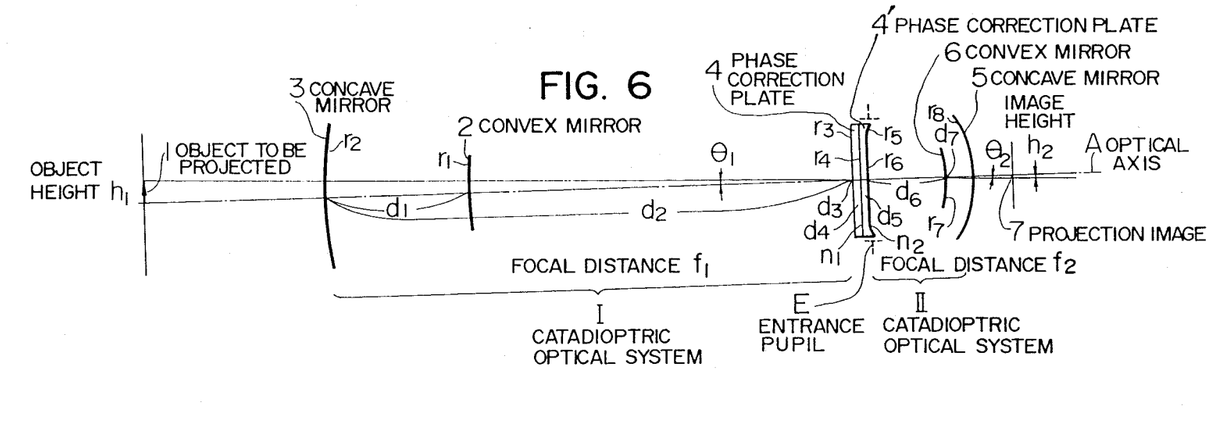
FIG. 6 is an explanatory diagram of the operation of the constitution of FIG. 5.

| Whole system f (focal distance): 100 mm | | |
|---|---|---|
| Effective F number (aperture ratio): 1.3 | | |
| Use wavelength: 200 nm | | |
| Magnification: 1/5 | | |
| $r_1 = 322.342$ | $d_1 = -120.170$ | Reflecting surface |
| $r_2 = 442.512$ (aspheric surface) | $d_2 = 442.512$ | Reflecting surface |
| $r_3 = 0$ (aspheric surface) | $d_3 = 5.935$ | $n_1 = 1.560769$ |
| $r_4 = 0$ | $d_4 = 0.119$ | |
| $r_5 = 0$ | $d_5 = 5.935$ | $n_2 = 1.560769$ |
| $r_6 = 0$ (aspheric surface) | $d_6 = 88.502$ | |
| $r_7 = -88.502$ (aspheric surface) | $d_7 = -24.034$ | Reflecting surface |
| $r_8 = -64.468$ | | Reflecting surface | where, as shown in FIG. 6, $r_1$: radius of curvature of the reflecting surface of the convex mirror 2

$r_2$: radius of curvature of the reflecting surface of the concave mirror 3

$r_3$, $r_4$: radius of curvature of each surface of the phase correction plate 4

$r_5$, $r_6$: radius of curvature of each surface of the phase correction plate 4'

$r_7$: radius of curvature of the reflecting surface of the concave mirror 5

$r_8$: radius of curvature of the reflecting surface of the convex mirror 6

$d_1$: distance between the reflecting surface of the convex mirror 2 and the reflecting surface of the concave mirror 3

$d_2$: distance between the reflecting surface of the concave mirror 3 and the surface on the incident side of the phase correction plate 4

$d_3$: thickness of the phase correction plate 4

$d_4$: distance between the phase correction plates 4 and 4'

$d_5$: thickness of the phase correction plate 4'

$d_6$: distance between the surface of the emitting side of the phase correction plate 4' and the reflecting surface of the concave mirror 5

$d_7$: distance between the reflecting surface of the concave mirror 5 and the reflecting surface of the convex mirror 6

$n_1$: refractive index of the phase correction plate 4

$n_2$: refractive index of the phase correction plate 4'

Aspheric surface coefficient: the coefficient in the case where a sag amount Z is expressed by the following equation $$Z = \frac{Ch^2}{1 + \sqrt{1 - (K+1)C^2h^2}} + A_4h^4 + A_6h^6 + A_8h^8 + A_{10}h^{10}$$

| Surface | K | $A_4$ | $A_6$ | $A_8$ | $A_{10}$ |
|---|---|---|---|---|---|
| $r_2$ | 0 | $-1.67 \times 10^{-11}$ | $-4.08 \times 10^{-16}$ | $-3.42 \times 10^{-21}$ | $3.73 \times 10^{-27}$ |
| $r_3$ | 0 | $-2.31 \times 10^{-9}$ | $-8.16 \times 10^{-15}$ | $-2.51 \times 10^{-20}$ | $8.64 \times 10^{-26}$ |
| $r_6$ | 0 | $-2.88 \times 10^{-7}$ | $2.54 \times 10^{-11}$ | $1.96 \times 10^{-15}$ | $-1.69 \times 10^{-19}$ |
| $r_8$ | 0 | $2.08 \times 10^{-9}$ | $1.27 \times 10^{-12}$ | $2.68 \times 10^{-16}$ | $-7.28 \times 10^{-21}$ | where, $K = -e^2$, e is an eccentricity, h is a light entrance height, $A_4$, $A_6$, $A_8$, and $A_{10}$ are aspheric surface coefficients of the surfaces $r_2$, $r_3$, $r_6$, and $r_8$, respectively, $C = 1/r$, and r is a radius of curvature.

Figure 7:
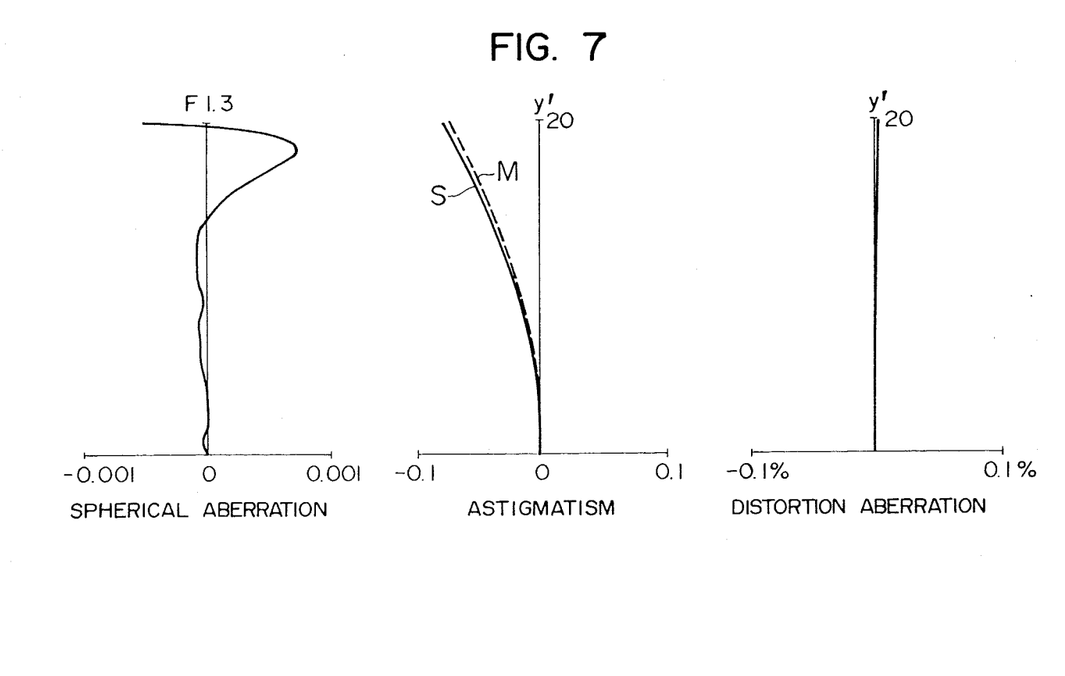
FIG. 7 shows aberration characteristic diagrams based on the constitution of FIG. 5.

FIG. 7 shows the spherical aberration, astigmatism, and distortion aberration according to the practical particulars.

Most of the spherical aberration is eliminated by the phase correction plates 4 and 4' of the aspheric surfaces each of which consists of fused quartz. The remaining high-degree spherical aberration is completely corrected by the concave mirrors 3 and 5.

With respect to the astigmatism, distortion aberration, and coma aberration, the concave mirrors 3 and 5 and the convex mirrors 2 and 6 are coaxially arranged with regard to the entrance pupil E, the convex mirrors 2 and 6 are formed into the spherical surfaces and are set to be concentric for the concave mirrors 3 and 5 even in the case of light out of the axis, respectively, thereby fairly reducing the amount of aberration generation. Moreover, in this embodiment, since only the fused quartz which is used to form the phase correction plates 4 and 4' is used as a refracting material, the transmittance above 60% is also derived in the case of the wavelength of λ=200 nm.

Figure 8:
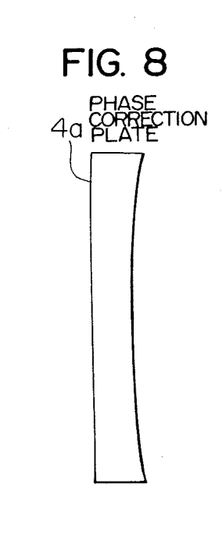
FIG. 8 is a cross sectional view of a phase correction plate in a projection optical system for a precise copy according to the second embodiment of the invention.

The second embodiment of the invention will now be described. In the second embodiment, as shown in FIG. 8, two phase correction plates 4 and 4' in the foregoing first embodiment are integrally coupled in the flat surface portions or they are previously formed as an integrated plate, and two pairs of catadioptric optical systems I and II commonly use a single phase correction member 4a. The remaining structures are similar to the first embodiments. The effects similar to those in the first embodiment can be also derived even in the second embodiment.

According to the invention, two pairs of catadioptric optical systems consisting of the concave mirror members, convex mirror members, and phase correction members are coupled so as to face each other on the coaxis through the phase correction members to thereby constitute one catadioptric optical system. Therefore, not only the spherical aberration as an aberration on the axis but also the coma aberration, astigmatism, and distortion aberration as aberrations to of the axis can be extremely reduced and the high resolving power can be derived. Since the main refracting force is obtained by the reflecting system, only the phase correction member is used as refracting material. High transmittances in the ranges of the ultraviolet rays and of the far ultraviolet rays can be obtained and the projection optical system of the invention can be applied to the ranges of the ultraviolet rays and of the far ultraviolet rays.

Figure 9:
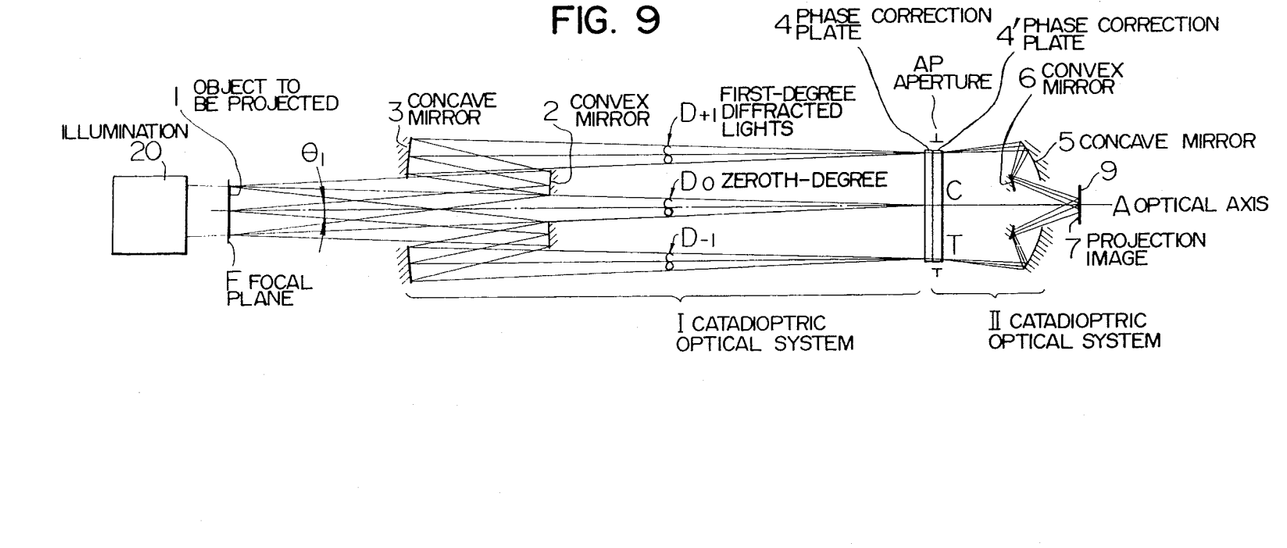
FIG. 9 is a schematic diagram of a projection optical system for use in a precise copy according to the third embodiment of the invention.
Figure 10:
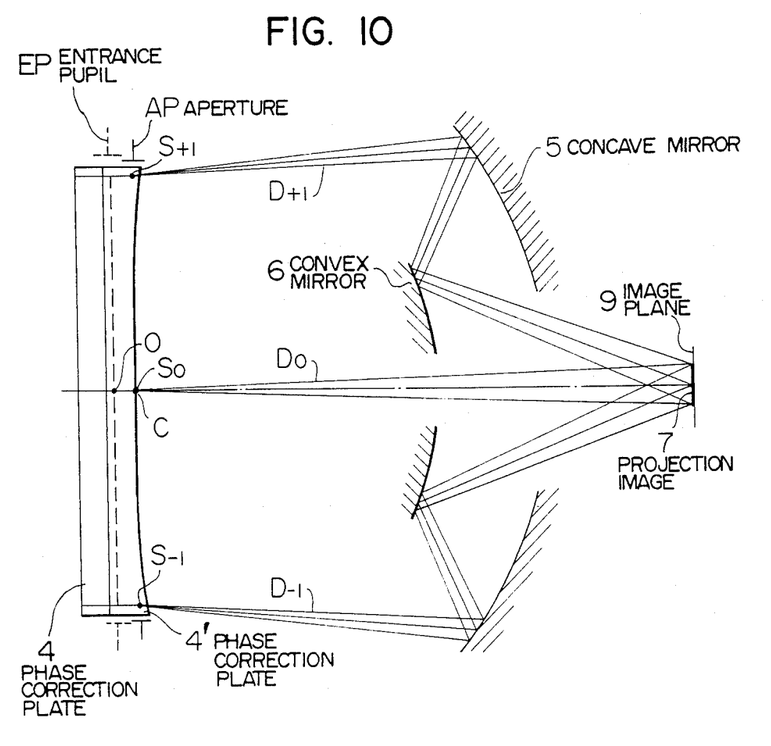
FIG. 10 is an enlarged diagram of the main part in FIG. 9.

FIG. 9 is an overall cross sectional view showing a projection optical system for use in a precise copy according to the third embodiment of the invention. FIG. 10 is an enlarged diagram of the main part thereof.

The catadioptric optical system I on the object point side is constituted by the convex mirror 2 having an opening at the center, the concave mirror 3 having an opening at the center, and the phase correction plate 4 whose one side is the flat surface. The object 1 to be projected is disposed on the focal plane F of the optical system I.

In the optical system I, the concave mirror 3, convex mirror 2, and phase correction plate 4 are arranged in accordance with this order for the object 1. The concave mirror 3 and convex mirror 2 are coaxially arranged with respect to an entrance pupil EP (which is given as an imaginary image of an aperture AP).

The catadioptric optical system II on the image point side is constituted by the phase correction plate 4' whose one side is the flat surface, concave mirror 5 having an opening at the center, and convex mirror 6 having an opening at the center. In the optical system II, the phase correction plate 4', convex mirror 6, and concave mirror 5 are arranged in accordance with this order for the object 1. The convex mirror 6 and concave mirror 5 are coaxially arranged with regard to the aperture AP.

The optical systems I and II are rotationally symmetric around the reference axis as a center and coupled so as to respectively face the phase correction plates 4 and 4' which are disposed on the coaxia at a slight distance away from each other.

The numerical aperture on the object point side in the third embodiment is 0.076 and the numerical aperture on the image point side is 0.38 and the magnitude is 1/5.

An illumination 20 emits coherent light and irradiates the whole object 1 so as to be converged and focused to the center of the entrance pupil EP after the light passes through the catadioptric optical system I.

The zeroth-degree diffracted light $D_0$, ± first-degree diffracted light $D_{+1}$ and $D_{-1}$, and further the high-degree diffracted light are generated from the object 1 which was illuminated by the coherent and convergent illumination 20. These diffracted lights enter the projecting lenses (I+II). In the third embodiment, the system is designed such that the incident angle which is determined by the numerical aperture ($NA=\sin\theta_0$) on the object point side of the projecting lenses (I+II) coincides with the angle $\theta_1$ of the first-degree diffracted light from the object 1. Therefore, none of the high-degree diffracted light above the second-degree diffracted light enters the projecting lenses (I+II).

Among the diffracted lights from the object 1, the ± first-degree diffracted lights $D_{+1}$ and $D_{-1}$ pass through the opening of the concave mirror 3 and are reflected by the convex mirror 2 to the side of the object 1. Thereafter, the reflected lights are again reflected by the concave mirror 3 and pass through the phase correction plate 4 and enter the phase correction plate 4' which is disposed at a slight distance away from the phase correction plate 4. The lights are converted and separated to the luminance point spectra $S_{+1}$ and $S_{-1}$ on the aperture AP. Then, the lights are further reflected by the concave mirror 5 to the side of the object 1 and again reflected by the convex mirror 6 to the side opposite to the object 1 and pass through the opening of the concave mirror 5.

Figure 11:
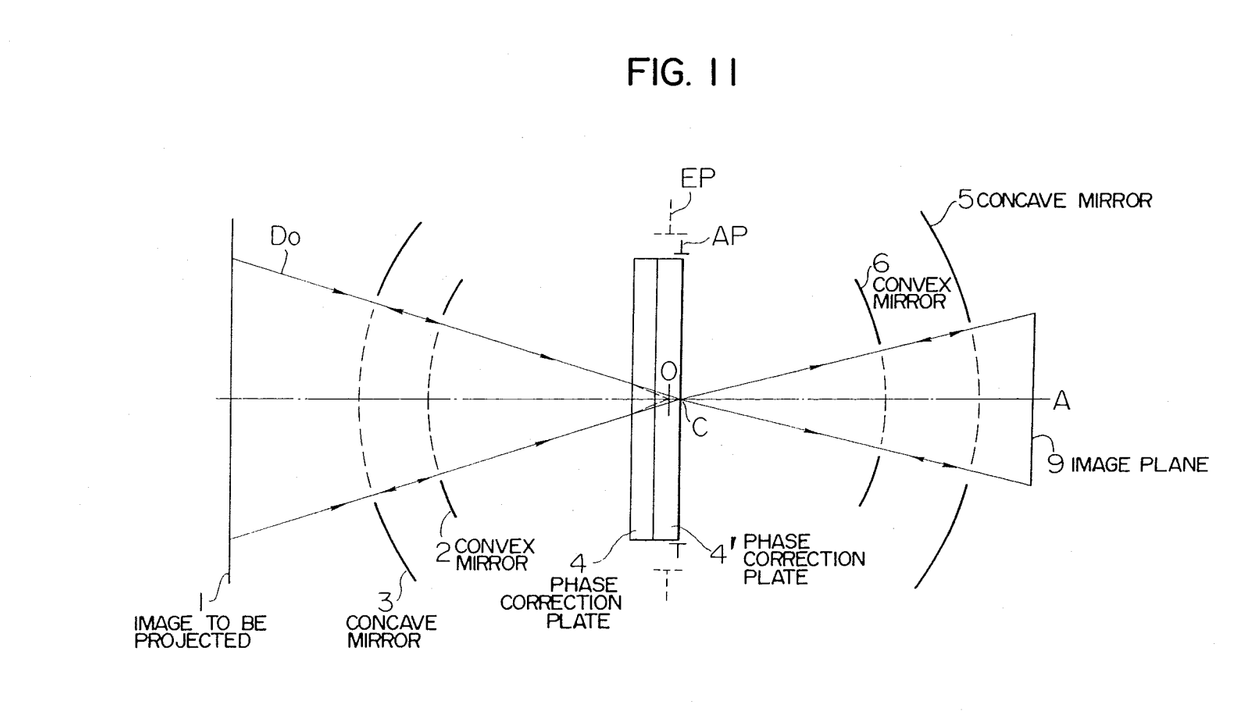
FIG. 11 is an explanatory diagram showing a transmitting state of the zeroth-degree diffracted light in the constitution of FIG. 9.

On the other hand, the zeroth-degree diffracted light $D_0$ progress through the opening of the concave mirror 3, opening of the convex mirror 2, and phase correction plates 4 and 4' so as to be converged to the center O of the entrance pupil EP. The light is focused to the centre C on the aperture AP and becomes the luminance point spectrum $S_0$. Thereafter, the light passes through the opening of the convex mirror 6 and the opening of the concave mirror 5.

The zeroth-degree diffracted light $D_0$ is not reflected by the concave mirror 3, convex mirror 2, concave mirror 5, and convex mirror 6. As shown in FIG. 3, the concave mirror 5 and convex mirror 6 are coaxially arranged with respect to the focal point C (i.e., Point C on the aperture AP) of the zeroth-degree diffracted light $D_0$. The concave mirror 3 and convex mirror 2 are coaxially arranged with regard to the center O of the entrance pupil EP as an imaginary image of the aperture AP. Thus, light is transmitted along the optical path similar to that in the case where they are reflected by the respective surfaces, so that no change occurs in the optical aberration.

The projection image is formed as interference fringes on an image plane 9 on which the zeroth-degree diffracted light $D_0$ and the ± first-degree diffracted lights $D_{+1}$ and $D_{-1}$ having the same size are overlapped.

In the third embodiment, only the fused quartz which is used to form the phase correction plates 4 and 4' is used as a refracting material. Therefore, the transmittance above 60% is derived even in the case of the wavelength in the range of the far ultraviolet rays of $\lambda=200$ nm.

In the third embodiment, as shown in FIG. 8, it is also possible to arrange structure such that two phase correction plates 4 and 4' are integrally coupled in their flat surface portions or previously integrally formed as a single plate and one phase correction member 4a is commonly used by two pairs of catadioptric optical systems I and II.

According to the invention, two pairs of catadioptric optical systems consisting of the concave mirror members having openings, convex mirror members having openings, and phase correction members are coupled so as to face on the coaxis around the phase correction members, thereby constituting one catadioptric optical system. The object to be projected is convergently illuminated by coherent light. Therefore, when the reflecting optical system is used as a rediffracting optical system, the aperature loss, which ordinarily causes a problem, does not occur and the projection of a fine pattern can be performed. On the other hand, since the main refracting force is obtained by the reflecting system, only the phase correction members are used as refracting materials. High transmittances can be obtained in the ranges of the ultraviolet rays and of the far ultraviolet rays and the system can be applied to the ranges of the ultraviolet rays and of the far ultraviolet rays. A high resolving power can be achieved.

We claim:

1. A projection optical system for use in making a precise copy, comprising:
    a pair of catadioptric optical systems each including an associated phase correction member, a convex mirror member having an opening at the center, and a concave mirror member having an opening at the center thereof, said convex mirror member and said concave member being arranged on a coaxis with a center of an entrance pupil,
    said pair of catadioptric optical systems being arranged rotationally symmetric around a reference axis as a center and being coupled coaxially by the associated phase correction member of each, one of said pair of catadioptric optical systems being arranged on a side of an object to be projected, and the other catadioptric optical system being arranged on aside of a projection image,
    said object being placed on a focal plane which is formed by one of said pair of catadioptric optical systems and on which said object is to be projected; and
    a coherent illuminating light source for convergently illuminating the object to be projected such that the illumination rays from said light source are focused by said one catadioptric optical system to the center of a plane of the entrance pupil.

2. A projection optical system according to claim 1, wherein:
    one of said pair of catadioptric optical systems, located on the side of the object to be projected, is arranged in a manner such that after the rays emitted from an object point pass through the opening of the concave mirror member thereof, a first part of the rays pass through the opening of the convex mirror member thereof and a second remaining part of the rays are reflected by the convex mirror member thereof to the concave mirror member thereof and are further reflected by the concave mirror member thereof, and both of said first and second parts of the rays pass through the phase correction member thereof, and
    the other of said pair of catadioptric optical systems, located on the side of the projection image, is arranged in a manner such that after the incident rays passed through the phase correction member thereof, a first part of the rays pass through the opening of the convex mirror member thereof and the opening of the concave mirror member thereof and a second remaining part of the rays are reflected by the concave mirror member thereof to the convex mirror member thereof and are further reflected by the convex mirror member thereof to the phase correction member thereof and pass through the opening of the concave mirror member thereof, and all of the rays are overlapped in a plane which is perpendicular to the reference axis and behind the concave mirror member thereof, so that an image is formed.

3. A projection optical system according to claim 1, wherein said pair of catadioptric optical systems have respective phase correction members which are arranged with a slight distance between them.

4. A projection optical system according to claim 1, wherein said pair of catadioptric optical systems commonly share one phase correction member as their associated phase correction member.

* * * * *